United States Patent
Kandala et al.

(10) Patent No.: US 9,166,584 B1
(45) Date of Patent: Oct. 20, 2015

(54) CURRENT-ENCODED SIGNALING

(71) Applicant: Xilinx, Inc., San Jose, CA (US)

(72) Inventors: Anil Kumar Kandala, Hyderabad (IN); Srinivasa L. Karumajji, Hyderabad (IN); Vikram Santurkar, Hyderabad (IN)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 14/300,146

(22) Filed: Jun. 9, 2014

(51) Int. Cl.
*H03K 19/173* (2006.01)
*H03K 19/00* (2006.01)
*H03K 19/0175* (2006.01)

(52) U.S. Cl.
CPC .... *H03K 19/0013* (2013.01); *H03K 19/017509* (2013.01); *H03K 19/017581* (2013.01)

(58) Field of Classification Search
CPC ............................. H03K 19/00; G06F 13/4072
USPC ..................................................... 326/38, 41
See application file for complete search history.

(56) References Cited

U.S. PATENT DOCUMENTS

| | | | | |
|---|---|---|---|---|
| 6,392,570 | B1* | 5/2002 | Bucht | 341/59 |
| 2010/0135430 | A1* | 6/2010 | Oh et al. | 375/295 |
| 2012/0215952 | A1* | 8/2012 | Werner et al. | 710/33 |
| 2014/0254712 | A1* | 9/2014 | Lee et al. | 375/295 |

* cited by examiner

*Primary Examiner* — Don Le
(74) *Attorney, Agent, or Firm* — LeRoy D. Maunu (57) ABSTRACT

An apparatus is disclosed for communication of data signals in a current-encoded format. The apparatus includes a first logic block and a second logic block. The first logic block includes a first voltage-mode logic (VML) circuit configured to provide a first voltage-encoded binary signal and an encoder circuit configured to convert the voltage-encoded binary signal to a current-encoded binary signal. The second logic block includes a decoder circuit configured to receive the current-encoded binary signal from the first logic block and convert the current-encoded binary signal to a second voltage-encoded binary signal. The logic states encoded by the second voltage-encoded binary signal are equal to the logic states encoded by the first voltage-encoded binary signal. The second logic block also includes a second VML circuit coupled to the decoder circuit and configured to receive and process the second voltage-encoded binary signal.

17 Claims, 5 Drawing Sheets

CURRENT-ENCODED SIGNALING

FIELD OF THE INVENTION

The disclosure generally relates to encoding signals in electronic circuits.

BACKGROUND

In electronic circuits, the value of a binary data signal is often represented by one of two respective voltage levels including a high voltage (e.g., logic 1) and a low voltage (e.g., logic 0). For ease of reference, such representation of data signals may be referred to as voltage-encoded binary signals. Inverters and/or drivers may be used to transmit voltage-encoded binary signals between circuits. The inverters and/or drivers assist to pull a signal line up or down to a rail-to-rail voltage used to represent the binary signal. However, inverters and/or drivers may consume a significant amount of power during operation. Furthermore, a significant amount of time is required to change the voltage levels of a signal line (e.g., from the logical 0 voltage to the logical 1 voltage). For ease of reference, the time required to change a signal from one encoded value to a different encoded value may be referred to as signaling delay.

SUMMARY

An apparatus is disclosed that is configured to communicate signals in a current-encoded format. The apparatus includes a first logic block and a second logic block. The first logic block includes a first voltage-mode logic (VML) circuit configured to provide a first voltage-encoded binary signal and an encoder circuit configured to convert the voltage-encoded binary signal to a current-encoded binary signal. The second logic block includes a decoder circuit configured to receive the current-encoded binary signal from the first logic block and convert the current-encoded binary signal to a second voltage-encoded binary signal. The logic states encoded by the second voltage-encoded binary signal are equal to the logic states encoded by the first voltage-encoded binary signal. The second logic block also includes a second VML circuit coupled to the decoder circuit and configured to receive and process the second voltage-encoded binary signal.

A programmable integrated circuit (IC) is also disclosed. The programmable IC includes a plurality of programmable logic blocks and a plurality of programmable routing resources for coupling the programmable logic blocks. The programmable logic blocks are configured to communicate data signals via the programmable routing resources in a current-encoded format.

A method is also disclosed for communicating data in a current-encoded format. At a first logic block, a first voltage-encoded binary signal provided by a first voltage-mode logic circuit is sampled. In response to the first voltage-encoded binary signal having a logic-high value, a current-encoded binary signal is set to a current above a threshold current. In response to the first voltage-encoded binary signal having a logic-low value, the current-encoded binary signal is set to a current below the threshold current. The current-encoded binary signal is provided from the first logic block to a second logic block. At the second logic block, the current-encoded binary signal is sampled. In response to the current-encoded binary signal having a current greater than or equal to the threshold current, a second voltage-encoded binary signal is set to the logic-high value. In response to the current-encoded binary signal having a current less than the threshold current, the second voltage-encoded binary signal is set to the logic-low value.

Other features will be recognized from consideration of the Detailed Description and Claims, which follow.

BRIEF DESCRIPTION OF THE DRAWINGS

Various aspects and features of the methods and circuits will become apparent upon review of the following detailed description and upon reference to the drawings in which.

DETAILED DESCRIPTION OF THE DRAWINGS

Methods and circuits are disclosed for communication of data between logic circuits as current-encoded signals. For example, in some binary implementations, a logic 1 may be represented as a signal having a current above a threshold reference current. Conversely, a logic 0 may be represented as a signal having a current below a threshold reference current. As one example, an apparatus includes a first logic block configured to communicate data to a second logic block in a current-encoded format. The first logic block includes a first voltage-mode logic (VML) circuit that processes first voltage-encoded binary signals. The first logic block includes an encoder circuit configured to convert a voltage-encoded binary signal output from the first VML circuit to a current-encoded binary signal. The second logic block includes a decoder circuit configured to receive the current-encoded binary signal from the first logic block and convert the current-encoded binary signal to a second voltage-encoded binary signal. The second logic block also includes a second VML circuit coupled to the decoder circuit and configured to receive and process the second voltage-encoded binary signal.

Use of current-encoded signals for communication of data may reduce signaling delay in comparison to voltage-encoded signals. As indicated above, the transmission of voltage-encoded signals requires a signal line to be charged/discharged to set the signal line to a voltage corresponding to the value of the voltage-encoded signal. Such charging/discharging takes a certain amount of time (rise and fall times) after a signal line has been connected to a current source. In contrast, time required to establish a specified current for the transmission of a current-encoded data value can be reduced to the switching speed of a transistor that connects the signal line to a current source.

Use of current-encoded signals may also reduce power consumption in comparison to transmission of voltage-encoded binary signals. As indicated above, inverters and/or drivers are often used for transmission of voltage-encoded binary signals. More specifically, a significant amount of power may be consumed by the inverters and/or drivers to quickly pull a signal line up or down to a rail-to-rail voltage used to represent the binary signal. In contrast, a current-encoded signal can be represented with current levels less than those used in the transmission of voltage-encoded signals. For instance, in one possible implementation, a current-encoded binary signal may represent a logic 0 with a 0 µA current and represent a logic 1 with a 2 µA current. In comparison, a driver may consume upwards of 64 µA to transmit a voltage-encoded signal on a signal line.

The disclosed methods and circuits may be adapted to encode a number of possible data values using current-encoded signals. For ease of explanation, the examples and figures herein are primarily described with reference to encoding of binary values. However, the methods and circuits may be adapted to encode bits having a greater number of possible values (e.g., ternary or quaternary values).

Figure 1:
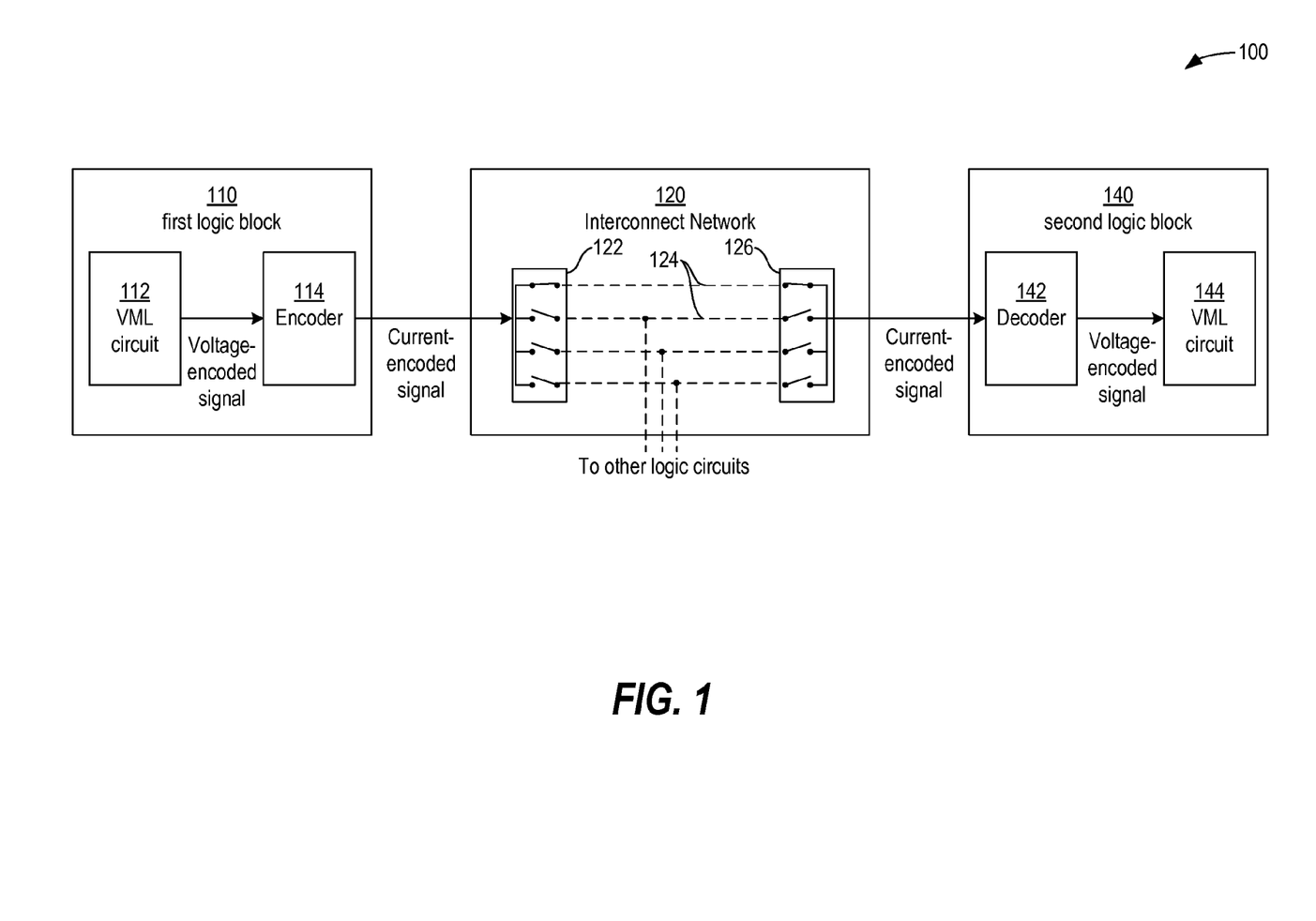
FIG. 1 shows a circuit having logic blocks configured to communicate data using current-encoded binary signals.

Turning now to the figures, FIG. 1 shows a circuit having logic blocks configured to communicate data using current-encoded binary signals. The circuit 100 includes a first logic block 110, a second logic block 140, and an interconnect network 120 configured to route signals from the first logic block 110 to the second logic block 140. The first logic block 110 includes a first VML circuit 112 configured to output a first voltage-encoded binary signal. The first logic block 110 also includes an encoder circuit 114 configured to convert the first voltage-encoded binary signal to a current-encoded binary signal.

The interconnect network communicates the current-encoded binary signal from the first logic block 110 to the second logic block 140. The interconnect network 120 may include, for example, a plurality of programmable routing resources configured to provide a single-ended signal path for communicating the current-encoded binary signal from an output of the encoder circuit 114 to an input of a decoder circuit 142. A single-ended signal path communicates a data signal over a single wire, where the data signal communicated is referenced to a ground voltage node. In this example, the interconnect network 120 includes a plurality of signal lines 124 (shown as dashed lines) and switching circuits 122 and 126 to connect the various logic blocks to each other via the signal lines 124. In the illustrated scenario, the switching circuits 122 and 126 are configured to connect the logic blocks 110 and 140 to a first one of the signal lines—thereby routing data from the output of the encoder circuit 114 to an input of a decoder circuit 142. In another scenario, the switching circuits 122 and 126 may be programmably reconfigured to connect the logic blocks 110 and 140 to other ones of the signal lines 124 and connect one or both of the logic blocks 110 and 140 with other logic circuits (not shown). The example interconnect network is provided for purposes of illustration. The examples may be adapted to use various other interconnect networks having various configurations of signal lines and switching/routing circuits. For instance, an interconnect network may include additional switching/routing circuits that connect/disconnect intersecting sets of signal lines to/from each other.

The second logic block 140 includes the decoder circuit 142 configured to receive and convert the current-encoded binary signal to a second voltage-encoded binary signal. Logic states encoded by the first and second voltage-encoded binary signals are equal. The second logic block 140 also includes a second VML circuit 144 configured to receive and process the second voltage-encoded binary signal.

Figure 2:
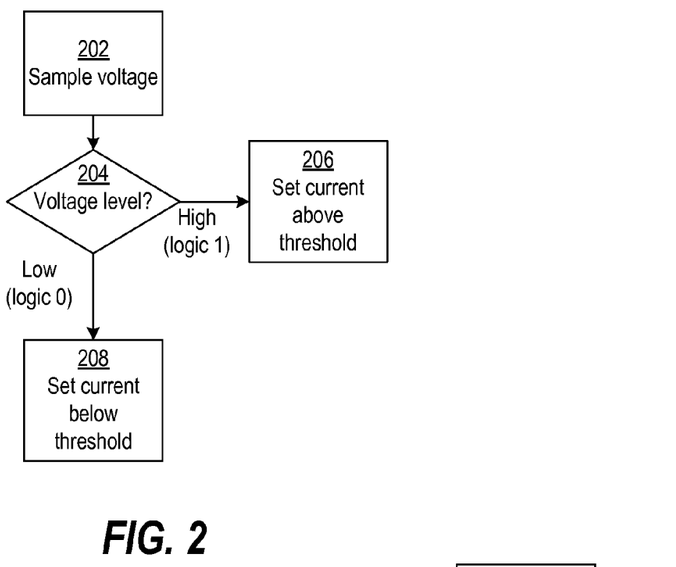
FIG. 2 shows a method for converting a voltage-encoded binary signal to a current-encoded binary signal.

FIG. 2 shows a method for converting a voltage-encoded binary signal to a current-encoded binary signal. A voltage of a voltage-encoded binary signal is sampled at block 202. If the sampled voltage has a high value (logic 1) at decision block 204, an output current-encoded binary signal is set to have a current above a reference current at block 206. Conversely, if the sampled voltage has a low value (logic 0) at decision block 204, an output current-encoded binary signal is set to have a current below a reference current at block 208.

Figure 3:
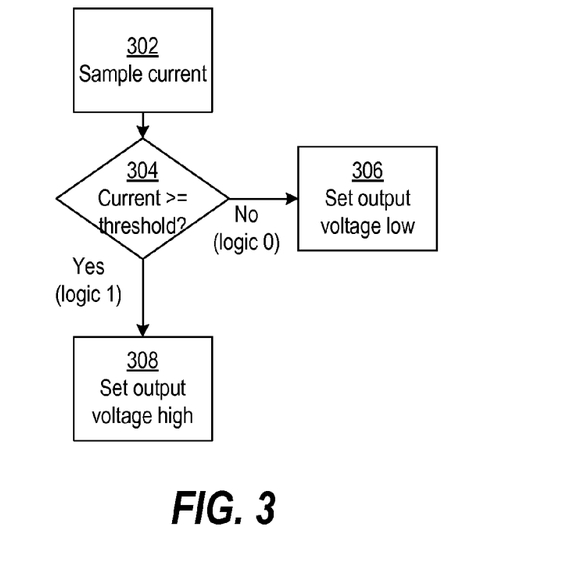
FIG. 3 shows a method for converting a current-encoded binary signal to a voltage-encoded binary signal.

FIG. 3 shows a method for converting a current-encoded binary signal to a voltage-encoded binary signal. A current of a current-encoded binary signal is sampled at block 302. If the sampled current is greater than a threshold current at decision block 304, an output voltage-encoded binary signal is set to have a logic-high voltage (logic 1) at block 308. Conversely, if the sampled current is less than the threshold current at decision block 304, an output voltage-encoded binary signal is set to have a logic-low voltage (logic 0) at block 306.

Figure 4:
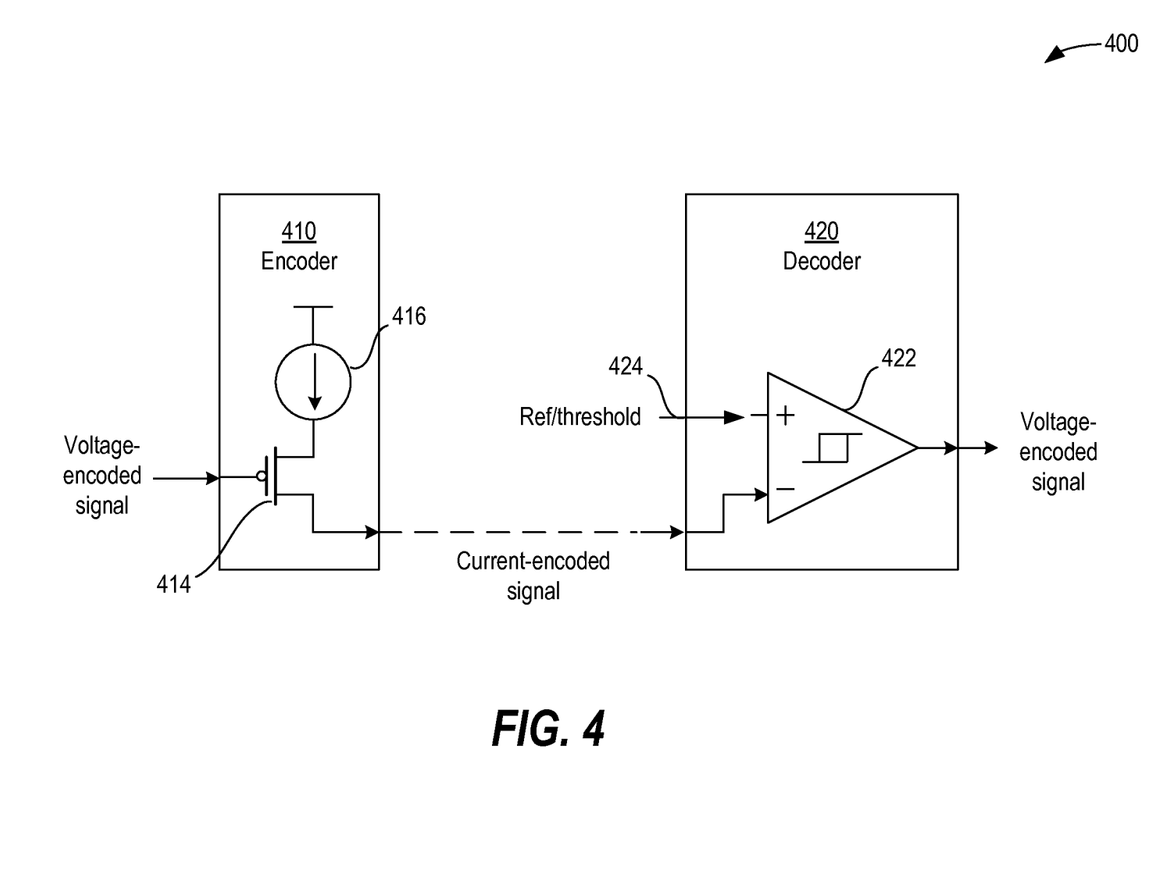
FIG. 4 shows an example circuit for encoding and decoding current-encoded binary signals.

FIG. 4 shows an example circuit for encoding and decoding current-encoded binary signals. The circuit 400 includes an encoder circuit 410 configured to convert a voltage-encoded binary signal to a current-encoded binary signal. The encoder circuit 410 is configured to set the current-encoded binary signal to have a current greater than a threshold current (Ref) in response to the first voltage-encoded binary signal having a logic-high value. The encoder circuit 410 is configured to set the current-encoded binary signal to have a current less than the threshold current (Ref) in response to the first voltage-encoded binary signal having a logic-low value. In this example, the encoder circuit includes a transistor 414 and a current source 416. Responsive to the voltage-encoded binary signal, the transistor 414 sets the current-encoded binary signal to have a current greater than the threshold current by connecting an output of the encoder circuit to the current source 416 or other voltage source (not shown). Conversely, the transistor 414 sets the current-encoded binary signal to have a current less than the threshold current by disconnecting the output of the encoder circuit from the power supply voltage.

The circuit 400 also includes a decoder circuit 420 configured to convert the current-encoded binary signal back to a voltage-encoded binary signal. In this example, the decoder circuit includes a current comparator 422 having a first input coupled to receive the current-encoded binary signal and a second input coupled to receive a reference current equal to the threshold current. In response to the current-encoded binary signal having a current greater than the reference/threshold current 424, the decoder circuit 420 provides a voltage-encoded binary signal with a logic-high value. Conversely, in response to the current-encoded binary signal having a current less than the threshold current (Ref), the decoder circuit 420 provides a voltage-encoded binary signal with a logic-low value.

Referring again to the example shown in FIG. 1, logic blocks are configured to communicate the current-encoded signal in one direction (e.g., from logic block 110 to logic block 140) over a signal line of interconnect network 120. In some implementations, logic blocks may be configured to communicate current-encoded signals in either direction over a signal line of an interconnect network.

Figure 5:
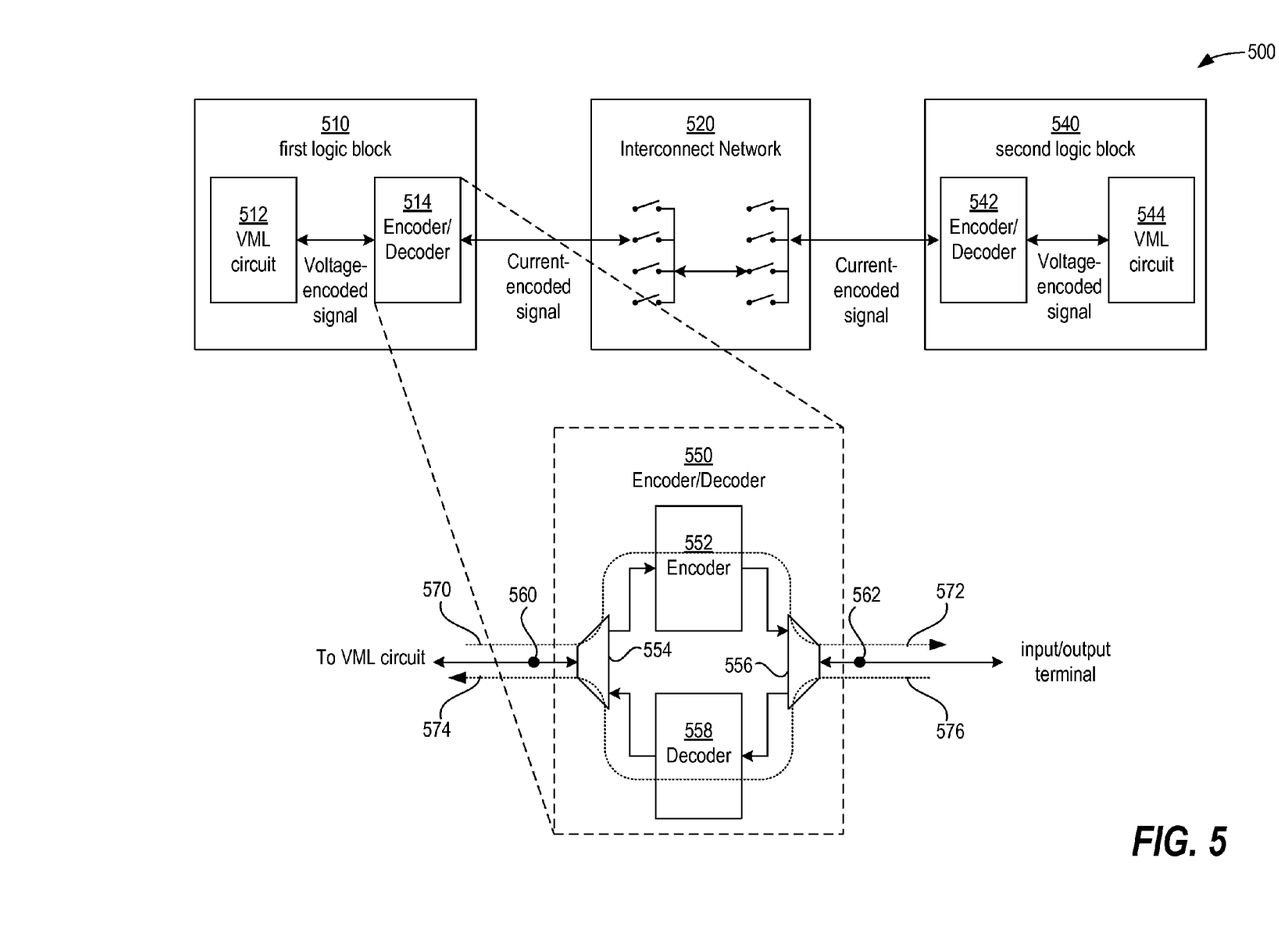
FIG. 5 shows a circuit having logic blocks configurable for bidirectional communication of current-encoded binary signals.

FIG. 5 shows an example circuit having logic blocks configurable for bidirectional communication of current-encoded binary signals. The circuit 500 includes a first logic block 510, a second logic block 540, and an interconnect network 520 configured to route signals between the first and second logic blocks 510 and 540. The first and second logic blocks 510 and 540 each include a respective VML circuit 512/544 configured to process voltage-encoded binary signals. Each of the first and second logic blocks 510 and 540 also includes a respective encoder/decoder circuit 514/542.

The encoder/decoder circuits 514 and 542 are configured to communicate data over an interconnect network 520 as current-encoded binary signals. The interconnect network 520 may include, for example, a plurality of programmable routing resources configured to route current-encoded binary signals between the encoder/decoder circuits 514 and 542 of the first and second logic blocks 510 and 540.

In each of the first and second logic blocks 510 and 540, the respective encoder/decoder 514/542 is configurable to either communicate data to or from the corresponding VML circuit 512/544 in a voltage-encoded format. Encoder/decoder circuit 550 shows an example circuit that may be used to implement the encoder/decoder circuits 514 and 542 in some implementations. The encoder/decoder circuit 550 includes an encoder circuit 552 configured to convert a voltage-encoded binary signal 570 to a current-encoded signal 572 (e.g., for transmission over the interconnect network 520). The encoder/decoder circuit 550 also includes a decoder circuit 558 configured to convert a current-encoded binary signal 576 to a voltage-encoded signal 574. The encoder/decoder circuit 550 also includes first and second demultiplexer 554 and multiplexer 556 configured to selectably connect/disconnect the encoder circuit 552 and decoder circuit 558 to/from the VML circuit 512 of the logic block 510.

For example, when operated in an encoder-mode, demultiplexer 554 connects an input terminal of the encoder circuit 552 to a VML-side terminal 560. Similarly, when operated in an encoder-mode, multiplexer 556 connects an output terminal of the encoder circuit 552 to a interconnect-side terminal 562. Conversely, when operated in a decoder-mode, demultiplexer 554 connects an input terminal of the decoder circuit 558 to the interconnect-side terminal 562 and multiplexer 556 connects an output terminal of the decoder to the VML-side terminal 560.

In the example shown in encoder/decoder 550, the encoder circuit 552 and the decoder circuit 558 share the communication path provided by the interconnect-side terminal 562. In some implementations, the encoder circuit 552 and the decoder circuit 558 may communicate over the interconnect network 520 using different terminals. In such implementations, the encoder and decoder may simultaneously communicate data—thereby enabling full-duplex communication between the first and second logic blocks 510 and 540.

As a more specific example, a first voltage-encoded signal provided by VML circuit 512 may be converted to a first current-encoded signal by encoder/decoder 514 and provided to encoder/decoder 542. Encoder/decoder 542 converts the first current-encoded signal to a second voltage-encoded signal, which is provided to VML circuit 544 for processing. Such processing is application dependent. At the same time a third voltage-encoded signal may be provided from VML circuit 544 to encoder/decoder 542. Encoder/decoder 542 converts the third voltage-encoded signal to a second current-encoded signal, which is provided to encoder/decoder 514. Encoder/decoder 514 converts the second current-encoded signal to a fourth voltage-encoded signal, which is provided to VML circuit 512 for processing.

Figure 6:
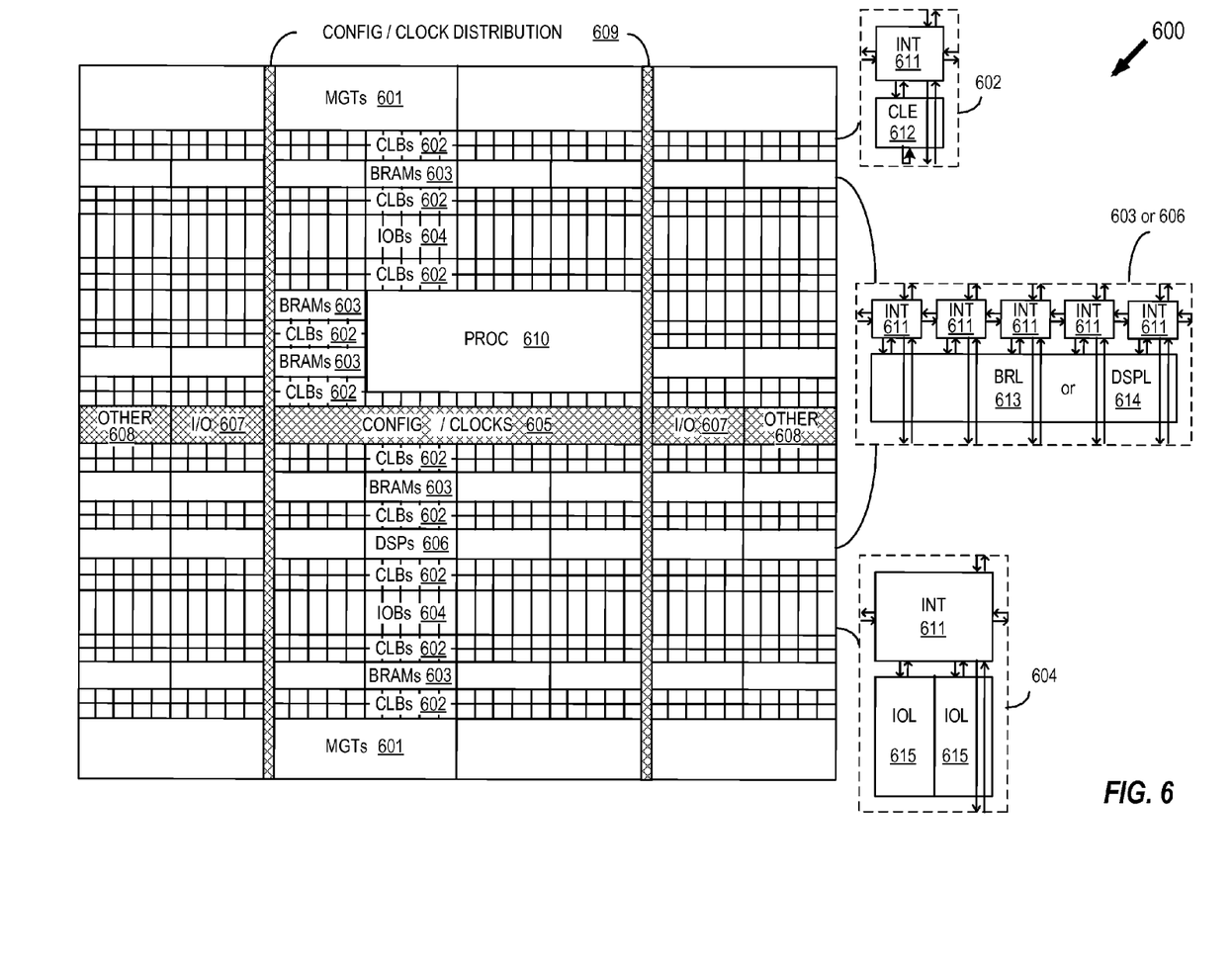
FIG. 6 shows an example programmable IC that may be configured in accordance with one or more embodiments.

FIG. 6 is a block diagram of an example programmable integrated circuit, specifically a field programmable gate array (FPGA) that may be configured to communicate data signals between logic blocks using current-encoded binary signals. FPGAs can include several different types of programmable logic blocks in the array. For example, FIG. 6 illustrates an FPGA architecture (600) that includes a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing blocks (DSPs) 606, specialized input/output blocks (I/O) 607, for example, clock ports, and other programmable logic 608 such as digital clock managers, analog-to-digital converters, system monitoring logic, and so forth. Some FPGAs also include dedicated processor blocks (PROC) 610 and internal and external reconfiguration ports (not shown).

In some FPGAs, each programmable tile includes a programmable interconnect element (INT) 611 having standardized connections to and from a corresponding interconnect element in each adjacent tile. Therefore, the programmable interconnect elements taken together implement the programmable interconnect structure for the illustrated FPGA. The programmable interconnect element INT 611 also includes the connections to and from the programmable logic element within the same tile, as shown by the examples included at the top of FIG. 6.

For example, a CLB 602 can include a configurable logic element CLE 612 that can be programmed to implement user logic, plus a single programmable interconnect element INT 611. A BRAM 603 can include a BRAM logic element (BRL) 613 in addition to one or more programmable interconnect elements. Typically, the number of interconnect elements included in a tile depends on the height of the tile. In the illustrated FPGA, a BRAM tile has the same height as five CLBs, but other numbers (e.g., four) can also be used. A DSP tile 606 can include a DSP logic element (DSPL) 614 in addition to an appropriate number of programmable interconnect elements. An IOB 604 can include, for example, two instances of an input/output logic element (IOL) 615 in addition to one instance of the programmable interconnect element INT 611. As will be clear to those of skill in the art, the actual I/O bond pads connected, for example, to the I/O logic element 615, are manufactured using metal layered above the various illustrated logic blocks, and typically are not confined to the area of the input/output logic element 615.

A columnar area near the center of the die (shown shaded in FIG. 6) is used for configuration, clock, and other control logic. Horizontal areas 609 extending from this column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA, more than one adjacent column of CLBs is typically included wherever the CLBs appear, to facilitate the efficient implementation of user logic.

The methods and circuits are thought to be applicable to a variety of applications. Other aspects and features will be apparent to those skilled in the art from consideration of the specification. For example, although aspects and features may in some cases be described in individual figures, it will be appreciated that features from one figure can be combined with features of another figure even though the combination is not explicitly shown or explicitly described as a combination. The methods and circuits may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. An apparatus, comprising:
a first logic block including:
a first voltage-mode logic (VML) circuit configured and arranged to provide a first voltage-encoded binary signal; and
an encoder circuit configured and arranged to convert the first voltage-encoded binary signal to a current-encoded binary signal, wherein the encoder circuit is further configured and arranged to:
set the current-encoded binary signal to have a current greater than a threshold current in response to the first voltage-encoded binary signal having a logic-high value; and
set the current-encoded binary signal to have a current less than the threshold current in response to the first voltage-encoded binary signal having a logic-low value; and
a second logic block including:
a decoder circuit configured and arranged to receive the current-encoded binary signal from the first logic block and convert the current-encoded binary signal to a second voltage-encoded binary signal, wherein logic states encoded by the second voltage-encoded binary signal are equal to logic states encoded by the first voltage-encoded binary signal;
a second VML circuit coupled to the decoder circuit and configured and arranged to receive and process the second voltage-encoded binary signal.

2. The apparatus of claim 1, further comprising:
an interconnect network having a plurality of programmable routing resources configured and arranged to provide the current-encoded binary signal from an output of the encoder circuit to an input of the decoder circuit.

3. The apparatus of claim 1, wherein the encoder circuit is configured to:
set the current-encoded binary signal to have a current greater than the threshold current by connecting an output terminal of the encoder circuit to a current source; and
set the current-encoded binary signal to have a current less than the threshold current by disconnecting the output terminal of the encoder circuit from the current source.

4. The apparatus of claim 1, wherein the decoder circuit is configured and arranged to convert the current-encoded binary signal to the second voltage-encoded binary signal by:
setting the second voltage-encoded binary signal to the logic-high value, in response to the current-encoded binary signal having a current greater than the threshold current; and
setting the second voltage-encoded binary signal to the logic-low value, in response to the current-encoded binary signal having a current less than the threshold current.

5. The apparatus of claim 1, wherein the decoder circuit includes a current comparator having a first input terminal coupled to receive the current-encoded binary signal and a second input terminal coupled to receive a reference current equal to the threshold current.

6. The apparatus of claim 1, wherein the first logic block is configured and arranged to communicate the current-encoded binary signal to the second logic block over a single-ended communication path.

7. The apparatus of claim 1, wherein:
the second logic block further includes an encoder circuit configured and arranged to convert a third voltage-encoded binary signal to a second current-encoded binary signal; and
the first logic block further includes a decoder circuit configured and arranged to receive the second current-encoded binary signal from the second logic block and convert the second current-encoded binary signal to a fourth voltage-encoded binary signal.

8. A programmable integrated circuit (IC), comprising:
a plurality of programmable logic blocks;
a plurality of programmable routing resources for coupling the programmable logic blocks; and
wherein the programmable logic blocks are configured and arranged to communicate data signals via the programmable routing resources in a current-encoded format;
wherein each of the plurality of programmable logic blocks includes:
a voltage-mode logic (VML) circuit configured and arranged to process voltage-encoded binary signals;
an encoder circuit configured and arranged to convert a first voltage-encoded binary signal output from the VML circuit to a first current-encoded binary signal and provide the first current-encoded binary signal to the programmable routing resources, wherein the encoder circuit is further configured and arranged to:
set the first current-encoded binary signal to have a current greater than a threshold current in response to the first voltage-encoded binary signal having a logic-high value; and
set the first current-encoded binary signal to have a current less than the threshold current in response to the first voltage-encoded binary signal having a logic-low value; and
a decoder circuit configured and arranged to receive a second current-encoded binary signal from the programmable routing resources, convert the second current-encoded binary signal to a second voltage-encoded binary signal, and provide the second voltage-encoded binary signal to the VML circuit.

9. The programmable IC of claim 8, wherein the encoder circuit is configured and arranged to:
set the first current-encoded binary signal to have a current greater than the threshold current by connecting an output of the encoder circuit to a current source; and
set the first current-encoded binary signal to have a current less than the threshold current by disconnecting the output of the encoder circuit from the current source.

10. The programmable IC of claim 8, wherein the decoder circuit is configured and arranged to convert the second current-encoded binary signal to the second voltage-encoded binary signal by:
setting the second voltage-encoded binary signal to the logic-high value, in response to the second current-encoded binary signal having a current greater than the threshold current; and
setting the second voltage-encoded binary signal to the logic-low value, in response to the second current-encoded binary signal having a current less than the threshold current.

11. The programmable IC of claim 8, wherein the decoder circuit includes a current comparator having a first input coupled to receive the second current-encoded binary signal and a second input coupled to receive a reference current equal to the threshold current.

12. The programmable IC of claim 8, wherein the programmable logic blocks are configured and arranged to communicate data signals in the current-encoded format via a single-ended signal path formed by the plurality of programmable routing resources.

13. The programmable IC of claim 8, further comprising, a demultiplexer having an input terminal connected to the VML circuit, a first output terminal connected to an input terminal of the encoder circuit, and a second output terminal connected to an output terminal of the decoder circuit.

14. The programmable IC of claim 13, further comprising, a multiplexer having a first input terminal connected to an output of the encoder circuit, a second input terminal connected to an input of the decoder circuit, and an output terminal connected to the plurality of programmable routing resources.

15. A method, comprising:
   at a first logic block:
      sampling a first voltage-encoded binary signal provided by a first voltage-mode logic circuit;
      in response to the first voltage-encoded binary signal having a logic-high value, setting a current-encoded binary signal to a current above a threshold current; and
      in response to the first voltage-encoded binary signal having a logic-low value, setting the current-encoded binary signal to a current below the threshold current;
   providing the current-encoded binary signal from the first logic block to a second logic block; and
   at the second logic block:
      sampling the current-encoded binary signal;
      in response to the current-encoded binary signal having a current greater than or equal to the threshold current, setting a second voltage-encoded binary signal to the logic-high value; and
      in response to the current-encoded binary signal having a current less than the threshold current, setting the second voltage-encoded binary signal to the logic-low value.

16. The method of claim 15, further comprising at the second logic block, processing the second voltage-encoded binary signal using a second voltage-mode logic circuit.

17. The method of claim 16, further comprising:
   at the second logic block:
      sampling a third voltage-encoded binary signal;
      in response to the third voltage-encoded binary signal having the logic-high value, setting a second current-encoded binary signal to a current above the threshold current; and
      in response to the first voltage-encoded binary signal having the logic-low value, setting the second current-encoded binary signal to a current below the threshold current;
   providing the second current-encoded binary signal from the second logic block to the first logic block; and
   at the first logic block:
      sampling the second current-encoded binary signal;
      in response to the second current-encoded binary signal having a current greater than or equal to the threshold current, setting a fourth voltage-encoded binary signal to the logic-high value; and
      in response to the second current-encoded binary signal having a current less than the threshold current, setting the second voltage-encoded binary signal to the logic-low value.

* * * * *